(12) United States Patent
Lee

(10) Patent No.: US 7,001,530 B2
(45) Date of Patent: Feb. 21, 2006

(54) METHOD FOR DETECTING THE END POINT BY USING MATRIX

(75) Inventor: Szetsen Steven Lee, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 331 days.

(21) Appl. No.: 10/657,247

(22) Filed: Sep. 9, 2003

(65) Prior Publication Data

US 2004/0112860 A1   Jun. 17, 2004

(30) Foreign Application Priority Data

Sep. 12, 2002  (TW) .............................. 91120919 A

(51) Int. Cl.
*G01L 21/30*   (2006.01)
*G01R 31/00*   (2006.01)
*H01L 21/302*  (2006.01)

(52) U.S. Cl. ........................... 216/59; 216/60; 438/710
(58) Field of Classification Search .................... None
See application file for complete search history.

(56) References Cited

U.S. PATENT DOCUMENTS

| | | | | |
|---|---|---|---|---|
| 5,121,337 A | * | 6/1992 | Brown ......................... | 702/28 |
| 5,288,367 A | * | 2/1994 | Angell et al. .................. | 216/60 |
| 5,479,340 A | * | 12/1995 | Fox et al. ...................... | 700/33 |
| 5,862,060 A | * | 1/1999 | Murray, Jr. .................. | 700/266 |
| 6,153,115 A | * | 11/2000 | Le et al. ........................ | 216/60 |
| 6,238,937 B1 | * | 5/2001 | Toprac et al. .................. | 438/9 |
| 2005/0016947 A1 | * | 1/2005 | Fatke et al. .................... | 216/2 |

* cited by examiner

*Primary Examiner*—Michael P. Stafira
(74) *Attorney, Agent, or Firm*—Bacon & Thomas PLLC

(57) ABSTRACT

A method for detecting the end point of plasma etching process by using matrix comprises a step of detecting a beginning matrix including emitting intensities and/or other plasma parameters of at least two different plasma species during beginning etching process. Then, a step of detecting an etching matrix is performed in which the etching matrix includes emitting intensities and/or other plasma parameters of the at least two different plasma species at the etching reaction. An end point matrix is then computed by using the beginning as well as etching matrices and compared to a reference end point matrix to decide whether the end point is reached.

14 Claims, 2 Drawing Sheets

Intensity Change at Endpoint (WSix/Poly)

Intensity difference (After -Before)

METHOD FOR DETECTING THE END POINT BY USING MATRIX

FIELD OF THE INVENTION

The present invention is a method for detecting the end point of plasma etching process, especially by using a matrix.

BACKGROUND OF THE INVENTION

Generally in the semiconductor processes, the process of Reactive Ion Etch (RIE) is used to etch imperceptible patterns on the silicon wafers. RIE includes a step of putting a wafer with photo-resist patterns into a reactive chamber with plasma. Plasma includes etching gas, which can be vertically decomposed in a RF (Radio Frequency) field. Therefore, the reactive ion in the etching plasma can leave the wafer surface accerlatively. The accelerated reactive ion includes the materials not covered by the photo-resist patterns on the wafer surface. Therefore, the volatile etching species will be produced. During the above etching process, one or multiple layers' materials or thin films can be removed. For example, the removed materials could be silicon oxide, polysilicon, silicon nitride, or metallic aluminum.

When a thin film not covered by the photo-resist pattern is etched, the volatile species will be merged into the plasma. Therefore, when the process of RIE comes to the end point, the etching gas will be decreased but the volatile etching species will be increased. These increased or decreased amount in the plasma could be traced back to decide whether the process of reactive ion etch goes to the end point or not. The FIG. 1 of U.S. Pat. No. 4,246,606 or 4,263,089 introduce a device with end point detecting method, wherein a photoelectric cell is utilized for transferring from the emission intensity of plasma to an electric current or voltage, and then the emission intensity of plasma is measured to decide every stage of the plasma etch process by the electric current or voltage.

There are many improvements of end point detecting method in the progress of semiconductor process. For example, in the U.S. Pat. No. 5,690,784, when a coated substrate is etched by plasma, there is a beam going through another monitor substrate with the same coating. The emission intensity of the beam will be changed during the process of etching. So we may decide whether the coated substrate comes to the end point of the process of REI or not by comparing the beam intensity with an expected value or a reference value. Further more, in the U.S. Pat. No. 5,160,576, the light produced by plasma discharge can go through a folded filter mirror to easily detect the end point by reducing the noises. And there still are other improvements of end point detecting method, just like U.S. Pat. Nos. 5,288,367, 4,936,967, 4,345,968, 4,687,539, 5,837,094, etc.

In the end point detecting method of reactive plasma etching, the process stability is very important. Usually there is a simple algorithm can decide the end point. This algorithm includes the delay time to bypass the unnecessary unstable duration produced by plasma at the radio frequency power-on. And then, the end point signal is averaged by the time during the stable duration. Finally, compare the average signal with the present signal level to decide the end of the process. At this moment, the emission of interested plasma species' single wavelength could be detected. There were several skills used to get better detecting efficiency of end point, which mainly enhance the mathematics to improve the average signal. For example, U.S. Pat. No. 5,565,114 calculates the summarized average intensity of plasma emission spectrum at first, and then calculates the difference or ratio of summarized average values to decide whether the etching process comes to the end point. However, this kind of skill can only be used in the stable processes or some unstable processes with guaranteed tolerance.

The much more complex methods include detecting two kinds of emission wavelengths concurrently. These methods are especially useful for detecting a weak emission in plasma. Usually the ratio between the two intensities of different wavelengths is used to detect the end point. However, due to the unstable characteristic of plasma, sensitive electrical instruments that surround the etching machine, and the sustaining changes of chamber's states, all these noises produced from every source will be pick up by the end point detecting device easily. Therefore, if the simple algorithm is used, then the computer system will misjudge an end point because a change of intensity from the RF power sudden surge or a polymer material. The other noises would come from the improper grounding, unstructured touching of chambers' components, the aging and lacking of electrical shielding components, contamination of chambers or wafers, or arcing in the plasma.

The instability of plasma is a very difficult problem to be overcome, but the other noise sources can be minimized by some mathematics methods, just like the time average. For the best result of time average, a long time is taken to calculate from the signal. This is impractical in the real process, and the improvement of manufacturing will be delayed by this solution very obviously.

SUMMARY OF THE INVENTION

According to the disadvantages of the conventional end point detecting methods, the main objective of the present invention is to compare an end point matrix with a referenced end point matrix to detect the end point.

Another objective of the present invention is to detect the intensity changes of two kinds of plasma species before and after etching by different wavelengths, and then to reduce different noise sources.

Another objective of the present invention is to quickly detect the end point by using matrix calculation.

According to the present invention, a method for detecting the end point comprises steps of: provide a reference end point matrix in the plasma etching process firstly. Secondly, detect the illuminant intensities of at least two kinds of plasma species within different wavelengths at the beginning of etching, and combine the illuminant intensities of the plasma species within different wavelengths for the elements of an initial matrix. Thirdly, detect the illuminant intensities of at least two kinds of plasma species within different wavelengths during the process of etching, and combine the illuminant intensities of these two kinds of plasma species within different wavelengths for an etching matrix corresponding to the initial matrix. Finally, calculate the initial matrix and the etching matrix to get an end point matrix, which etching matrix equals to the multiplication of the initial matrix and the end point matrix, and detect whether the etching process comes to the end point or not by comparing the end point matrix with the reference end point matrix.

The present invention may best be understood through the following description with reference to the accompanying drawings, in which:

DETAILED DESCRIPTION OF THE PREFERRED EMBODIMENT

Figure 1:
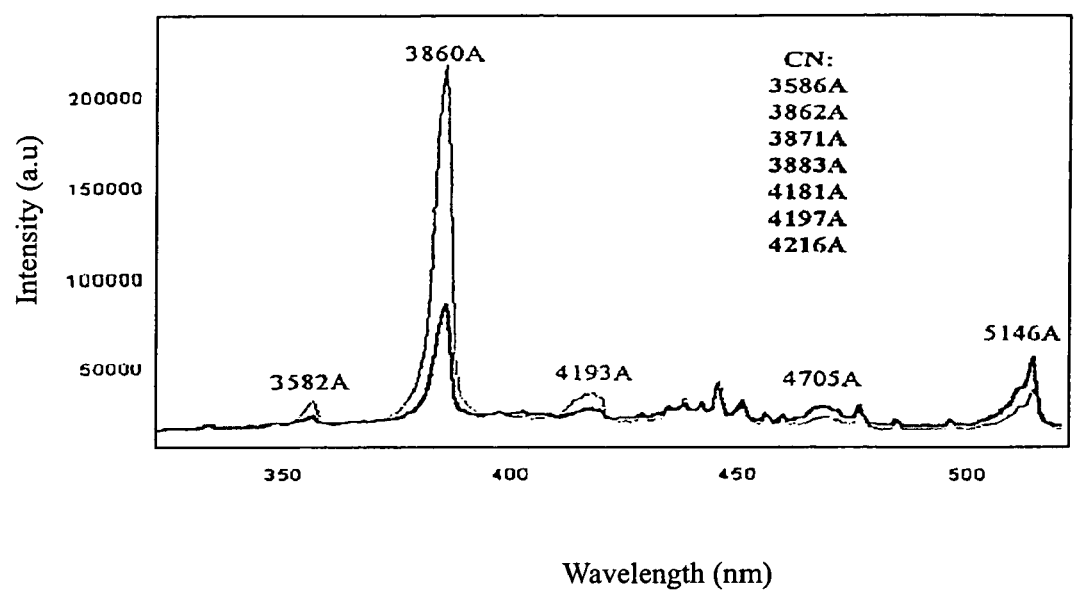
FIG. 1 shows the intensities of CN plasma before and after etching process within different wavelengths.
Figure 1:
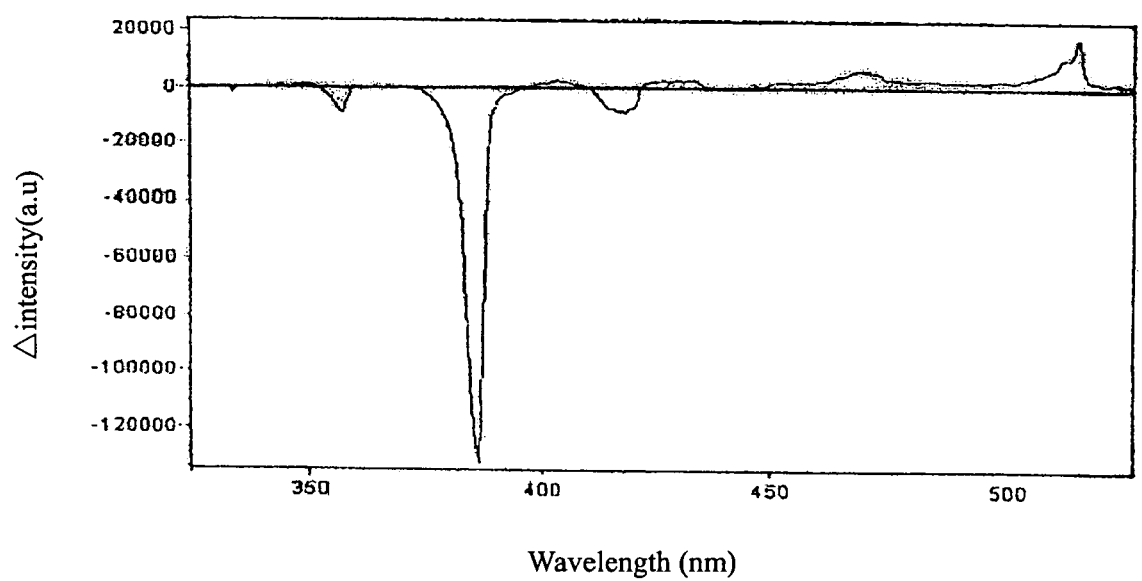

Some embodiment examples of the present invention will be well described as below. However, the present invention could also be used at some other embodiment except following description, and the field of the present invention will not be limited and would be based on the claims of the present invention.

The present invention provides an end point detecting method by using matrix. The main steps is: detecting the illuminant intensities of at least two plasma species within different wavelengths at the beginning of etching, and combining the illuminant intensities of these two kinds of plasma species within different wavelengths for the elements of the initial matrix. Then detect the illuminant intensities at least two plasma species within different reflecting wavelengths during the process of etching, and combine the illuminant intensities of these plasma species within different wavelengths for the elements of the etching matrix. And then calculate the initial matrix and etching matrix to get the end point matrix, where the etching matrix equals to the multiplication of the initial matrix and the end point matrix. Then detect whether the etching process comes to the end point or not by comparing the end point matrix with the reference end point matrix.

The different rows of the initial matrix and etching matrix present the different types of plasma species, and every element of every column includes the intensity of plasma within different illuminant wavelengths. Further more, the initial matrix and the etching matrix also include a plasma parameters column, where every element presents the plasma parameter of the plasma etching process. The illuminant intensities detection of plasma species will use the charge couple device (CCD) matrix of the optical channel analyzer.

The steps of getting the reference end point matrix are as follows. In plasma etch process test, detect a first matrix at the beginning of etching, where the first matrix includes the illuminant intensities of at least two kinds of plasma species within different wavelengths before etching process. Secondly, detect a second matrix after the etching process is completed, where, corresponding to the first matrix, the second matrix includes the illuminant intensities of the two or more kinds of plasma species within different wavelengths after the etching process. By calculating the first matrix and the second matrix, we may get the reference end point matrix, where the second matrix equals to the multiplication of the first matrix and the reference end point matrix.

Here is an embodiment example of end point detecting algorithm according to the present invention. Please refer to FIG. 1. We may observe the different emission plasma species during the plasma etching process. Every kind of plasma has its own characteristic emission wavelength $\lambda$. Depending on above reacting mechanism, the intensity of $\lambda$ will be changed by the plasma etching time (B) and the endpoint arriving time (A). Therefore, if the intensity of $\lambda$ is stronger, then the intensity difference B−A would be plus, which presents the plasma species i locate at the $j^{th}$ state; if B−A is minus, which presents plasma species i do not locate at the $j^{th}$ state and with weaker emission intensity.

Because most of the noise factors exist concurrently, therefore it is not very assured to detect the end point by observing only one or two changes of the emission wavelengths. There is an expanding and rigid method that can really reflect the real time situation of the chamber during the plasma etching process, i.e. monitoring the end point by multiple plasma species and their wavelengths concurrently. Based on above concept, we define an end point matrix X that can meet the following formula:

$$BX=A,$$

where matrix B and A include the illuminant intensities of every kinds of plasma species within different wavelengths at the beginning and ending time of etching process. Every element of the matrix row presents the intensity of different wavelength j of every kind of plasma species i.

$$B = \begin{bmatrix} b_{11} & b_{12} & \cdots & b_{1x} \\ b_{21} & b_{22} & \cdots & b_{2x} \\ \vdots & \vdots & \ddots & \vdots \\ b_{x1} & b_{x2} & \cdots & b_{xx} \end{bmatrix},$$

$$A = \begin{bmatrix} a_{11} & a_{12} & \cdots & a_{1x} \\ a_{21} & a_{22} & \cdots & a_{2x} \\ \vdots & \vdots & \ddots & \vdots \\ a_{x1} & a_{x2} & \cdots & a_{xx} \end{bmatrix},$$

$$X = \begin{bmatrix} x_{11} & x_{12} & \cdots & x_{1x} \\ x_{21} & x_{22} & \cdots & x_{2x} \\ \vdots & \vdots & \ddots & \vdots \\ x_{x1} & x_{x2} & \cdots & x_{xx} \end{bmatrix}$$

In general condition, matrix X should be unchangeable (just like the ratio B/A should be a constant for the two wavelengths example). The relationship of intensity changes between A and B would follow the fundamental molecular reaction dynamics and the spectrum rules. However, the external conditions, just like the interruptions of polymers on the chamber's walls or the gas contamination, would also force to the change of intensity's background of A or B. Of course, the ratio of X is changeable. Therefore, the matrix X can be used to be the index of the condition change of the end point.

Figure 2:
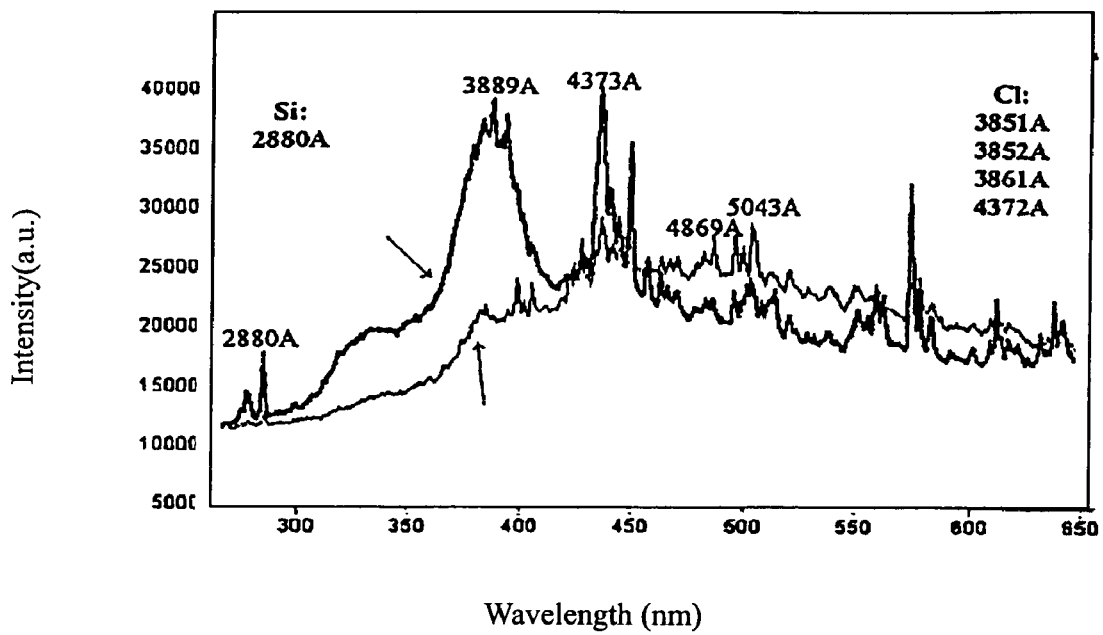
FIG. 2 shows the intensities of another Si plasma before and after etching process within different wavelengths.
Figure 2:
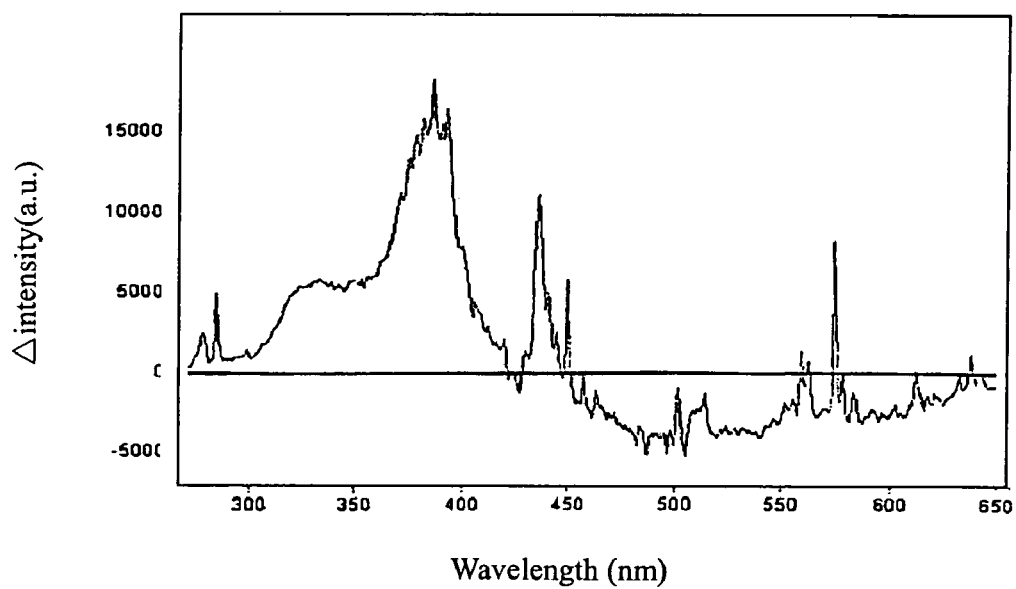

FIG. 1 and FIG. 2 show the general plasma emission spectrums before and after etching process respectively. For example, there are several emission wavelengths of CN plasma detected in FIG. 1, and every wavelength would have its own intensity change after etching process. We may find a lower intensity at $\lambda=3860A$ after etching, but there is a higher intensity at $\lambda=5146A$ before etching. In general dielectrics etching but except the CN plasma, different F, CF2, O, and CO plasma can be used for detecting. FIG. 2 shows a better description for the present invention. The silicon emission intensity will be enhanced at $\lambda=2880A$ after etching, but the intensity will be reduced at $\lambda=5043A$ after etching. In the typical polysilicon etching process, different H, Br, O, F, SiF, SiCl plasma can also be used for detecting except Si and Cl plasma. Therefore, if using the polysilicon etching as a practical example, the end point matrix can be written as:

$$B = \begin{bmatrix} Cl^b_{3851} & Cl^b_{3852} & Cl^b_{3861} & Cl^b_{4372} \\ Si^b_{2880} & 0 & 0 & 0 \\ SiF^b_{3360} & SiF^b_{4400} & SiF^b_{7770} & 0 \\ SiCl^b_{2514} & SiCl^b_{2820} & SiCl^b_{2871} & 0 \end{bmatrix},$$

$$A = \begin{bmatrix} Cl^a_{3851} & Cl^a_{3852} & Cl^a_{3861} & Cl^a_{4372} \\ Si^b_{2880} & 0 & 0 & 0 \\ SiF^a_{3360} & SiF^a_{4400} & SiF^a_{7770} & 0 \\ SiCl^a_{2514} & SiCl^a_{2820} & SiCl^a_{2871} & 0 \end{bmatrix},$$

$$X = \begin{bmatrix} x_{11} & 0 & 0 & 0 \\ x_{21} & x_{22} & x_{23} & 0 \\ x_{31} & x_{32} & x_{33} & 0 \\ x_{41} & x_{42} & x_{43} & x_{44} \end{bmatrix}$$

The 4×4 matrixe shown above is the end point matrix, which are combined by 4 kinds of plasma species (Cl, Si, SiF, and SiCl) with maximum emission wavelengths. The lower labels of matrix A's and matrix B's elements present the detected emission wavelengths. The upper labels of matrix A's and matrix B's elements present the intensity after etching process. Some elements are 0 in the matrix X. This is the characteristic of matrix A and matrix B. The characteristics of elements in the matrix X depend on the arrangements of the elements in matrix A and matrix B.

In the plasma etching producing testing process, if the matrix X, which is calculated after the matrix A and matrix B, are completed to measure, then it can be used as a reference end point matrix $X_{ref}$ of polysilicon etching process. And then, in general polysilicon etching process, we only need to detect every element of matrix B at the beginning of etching process, and detect every element of matrix A during etching process, therefore the end point matrix X could be able to get by formula BX=A. Finally, we may judge the etching process comes to the end point or not by comparing the end point matrix X with the reference end point matrix Xref.

The most advantage of the end point detecting method of the present invention is, there are multiple kinds of plasma species within multiple wavelengths can be detected and modified concurrently. The changes of external conditions would be separated in every element of the matrix X. Under suitable fluctuation criteria or tolerance, the end point detecting should be more exact than the other traditional methods.

About the concurrent detection of emissions with multiple wavelengths for multiple kinds of plasma species, the light emitted from plasma will be connected to and received by the charge coupled device (CCD) matrix of optical channel multi-analyzer (OMA) with all spectrum analysis. The changes of intensities and the elements of matrix can be quickly analyzed by the computer and be decided when the process will come to the end point at a suitable time.

The most important feature of the present invention is the illuminant emission spectrum within the plasma species. The same method can be expanded to the other plasma parameters that detected at the same time. In the matrix method of the present invention, the reaction of plasma would be the most useful parameter in the RF impedance changes of possible touch points in the end point detection. Therefore, based on the matrix after etched, the matrix would probably be:

$$A = \begin{bmatrix} Cl^a_{3851} & Cl^a_{3852} & Cl^a_{3861} & Cl^a_{4372} \\ Si^a_{2880} & 0 & 0 & 0 \\ SiF^a_{3360} & SiF^a_{4400} & SiF^a_{7770} & 0 \\ V^a_1 & V^a_2 & V^a_3 & V^a_4 \end{bmatrix}$$

Where Vi of the last row in above matrix have different plasma parameters, which could probably include the chamber pressure, the running amount of reactive gas, the RF power, the RF impedance, the RF matching capacitance, and the peak-to-peak voltage.

The end point detecting method by matrix of the present invention is able to detect the intensity changes of at least two kinds of plasma species within different wavelengths before and after etching, so the present invention can reduce the noise produced by a single wavelength of a single plasma very efficiently. Furthermore, corresponding to the time average, the calculation of matrix can quickly judge whether the plasma etching process comes to the end point or not indeed. This is really great for end point detecting.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for detecting an end point comprising steps of:
   providing a reference end point matrix in a plasma process;
   detecting an illuminant intensities of at least two kinds of plasma species within different wavelengths at the beginning of said plasma process, and combining said illuminant intensities of at least two kinds of plasma species within different wavelengths for the elements of an initial matrix;
   detecting said illuminant intensities of at least two kinds of plasma species corresponding to different wavelengths during said plasma process, and combining said illuminant intensities of said two kinds of plasma species within different wavelengths for the elements of a processing matrix;
   calculating said initial matrix and said processing matrix to get an end point matrix, and said initial matrix times said end point matrix being said processing matrix; and
   detecting said end point of said plasma process by comparing said end point matrix with a reference end point matrix.

2. A method according to claim 1, wherein different rows of said initial matrix and said processing matrix p resent different kinds of plasma species.

3. A method according to claim 2, wherein every row element of said initial matrix and said processing matrix includes the intensity of the same plasma within different illuminant wavelengths.

4. A method according to claim 1, wherein said initial matrix and said process matrix include an plasma parameter row, and every element of said plasma parameter row is a plasma parameter of said plasma process.

5. A method according to claim 4, wherein said plasma parameter choose from a chamber pressure, a running amount of reactive gas, a RF power, a RF impedance, a RF matching capacitance, and a peak-to-peak voltage.

6. A method according to claim 1, wherein detecting illuminant intensity of at least two kinds of plasma species within different wavelengths uses a charge coupled device (CCD) matrix of optical channel analyzer.

7. A method according to claim 1, wherein a method of getting said reference end point matrix comprises steps of:
during a plasma test plasma process, detecting illuminant intensities of at least two kinds of plasma species within different wavelengths at the beginning of said plasma process, and combining said illuminant intensities of these two kinds of plasma species within different wavelengths for elements of a first matrix;
detecting illuminant intensities of at least two kinds of plasma species within different reflecting wavelengths during at the end of said plasma process, and combining said illuminant intensities of these two kinds of plasma species within different wavelengths for elements of a second matrix corresponding to said first matrix; and
calculating said first matrix and said second matrix to get said reference end point matrix, and said first matrix times said reference end point matrix is said second matrix.

8. A method according to claim 1, wherein said plasma process is a plasma etching process.

9. A method for detecting an end point comprising steps of:
detecting a first matrix at the beginning of a test plasma process, said first matrix having plasma parameters of at least two kinds of plasma species within different wavelengths before etching;
detecting a second matrix at the end of said plasma process, and corresponding to said first matrix, said second matrix having said plasma parameters of said two kinds of plasma species within different wavelengths;
getting a reference end point matrix by calculating said first matrix and said second matrix, and said first matrix times said reference end point matrix being said second matrix;
during a plasma process, detecting plasma parameters of at least two kinds of plasma species within different wavelengths at the beginning of etching, and combining said plasma parameters of said two kinds of plasma species for elements of an initial matrix;
detecting said two kinds of plasma parameters of plasma species within different wavelengths during the progress of said plasma process, and corresponding to said initial matrix, combining said plasma parameters of said two kinds of plasma species within different wavelengths for a process matrix;
calculating said initial matrix and said process matrix to get an end point matrix, and said initial matrix times said end point matrix being said process matrix; and
comparing said end point matrix with said reference end point matrix to detect said end point of said plasma process.

10. A method according to claim 9, wherein said different rows of said initial matrix and said process matrix present different kinds of plasma species.

11. A method according to claim 10, wherein every element of every column of said initial matrix and said process matrix includes intensity of within different illuminant wavelengths of the same kind of plasma.

12. A method according to claim 9, wherein said plasma parameter choose from a chamber pressure, a running amount of reactive gas, a RF power, a RF impedance, a RF matching capacitance, and a peak-to-peak voltage.

13. A method according to claim 12, wherein detecting said illuminant intensity of said two kinds of plasma species within different wavelengths uses a charging coupled device matrix of an optical channel analyzer.

14. A method according to claim 9, wherein said plasma process is a plasma etching process.

* * * * *